United States Patent [19]
Klumpp et al.

[11] Patent Number: 5,506,008
[45] Date of Patent: Apr. 9, 1996

[54] METHOD OF APPLYING A LACQUER FILM SENSITIVE TO ULTRAVIOLET AND/OR ELECTRON RADIATION

[75] Inventors: Armin Klumpp, München; Erwin Hacker, Kaufbeuren, both of Germany

[73] Assignee: Fraunhofer-Gesellschaft zur Förderung Der Angewandten Forschung e.V., Munich, Germany

[21] Appl. No.: 277,495

[22] Filed: Jul. 19, 1994

Related U.S. Application Data

[63] Continuation of PCT/DE92/00777 filed Sep. 10, 1992, abandoned.

[30] Foreign Application Priority Data

Jan. 30, 1992 [DE] Germany .......................... 42 02 652.0

[51] Int. Cl.⁶ ...................................................... C08J 7/04
[52] U.S. Cl. .......................... 427/515; 427/509; 427/510; 427/255.1; 427/255.6; 427/314
[58] Field of Search .............................. 427/255.6, 255.1, 427/314, 509, 510, 515; 156/643

[56] References Cited

U.S. PATENT DOCUMENTS

| | | | |
|---|---|---|---|
| 4,348,473 | 9/1982 | Okumura et al. | 430/296 |
| 4,460,436 | 7/1984 | Hiraoka | 156/643 |
| 4,517,730 | 5/1985 | Meignant | 29/571 |
| 5,231,058 | 7/1993 | Maeda et al. | 437/235 |

FOREIGN PATENT DOCUMENTS

| | | | |
|---|---|---|---|
| 0136421 | 4/1985 | European Pat. Off. | G03F 7/10 |
| 0382932 | 8/1990 | European Pat. Off. | G03F 7/075 |
| 0279329 | 5/1990 | German Dem. Rep. | |
| 4018449 | 10/1991 | Germany | H01L 21/316 |
| 8912507 | 12/1989 | WIPO | C23C 16/40 |

*Primary Examiner*—Roy V. King
*Attorney, Agent, or Firm*—Ralph H. Dougherty; Scott E. Hanf

[57] ABSTRACT

Lacquer films sensitive to ultraviolet (UV) and/or electron beam radiation are applied to substrates as masking layers by a process known as the "spin on process". This invention is a new method of applying a lacquer film sensitive to UV and/or electron beam radiation. A vinyl-containing substance and a linear or cyclic siloxane are vaporized and then deposited onto the substrate to be masked. In the preferred embodiment of the invention, the substances utilized are octamethylcyclotetrasiloxane and trivinylmethylsilane.

7 Claims, 3 Drawing Sheets

METHOD OF APPLYING A LACQUER FILM SENSITIVE TO ULTRAVIOLET AND/OR ELECTRON RADIATION

This is a continuation of PCT/EP92/00777 filed Sep. 10, 1992, abandoned.

FIELD OF THE INVENTION

The present invention refers to a method of applying a lacquer film which is sensitive to ultra violet (UV) and/or electron beam radiation to a substrate to be masked. More specifically, the present invention deals with the application of a lacquer film, which is adapted to be used as a mask for lithography in the manufacturing process of electronic circuits with high component density.

BACKGROUND OF THE INVENTION

The requirements which have to be fulfilled by lithography increase in proportion to an increase in the component density of electronic circuits. The smaller the structural dimensions become, the more critical is the depth of focus of the image. It is old and well known to compensate for topographic height differences of an integrated circuit (IC) surface prior to exposure. For this purpose, a bilayer technique is used as well as several other techniques. The bilayer technique first comprises the application of a lower layer, which is also referred to as bottom resist, to a surface of the IC by means of a planarizing spin-on method. This lower layer consists of a carbon compound, which is resistant to the fluorine and chlorine, and which does not show any photosensitive. Due to this planarizing layer, the unevenness of the resultant surface lies within the depth of focus of the image. The upper lacquer film, also referred to as top resist, which is sensitive to UV and/or electron beam radiation can now be applied. The exclusive means for accomplishing the above described process is the spin-on technique. Once the upper layer has been exposed to ultraviolet light or electron beam radiation and has been developed, it serves as a mask for the bottom resist. Hence, the top resist must be resistant to $O_2$-RIE (oxygen reactive ion etch) and should contain the highest possible percentage of silicon and silicon dioxide, in addition to the reactive functional groups.

Until now, the upper lacquer layer or top resist lacquer has been prepared by complicated methods, and has been applied to the surface of the wafer as a thin polymer layer by means of the known centrifugal method, i.e., the so-called spin-on technique. Depending on the desired fields of use with respect to exposure wavelength and sensitivity, the following functional groups may be incorporated into the top resist lacquers for the centrifugal method: ethoxy (—$OC_2H_5$), hydroxy (—OH) with catalyst, vinyl (—CH=$CH_2$), chloromethyl (—$CH_2Cl$), phenylallyl, chloromethylphenethyl and Si—Me.

The preparation, production and processing by the centrifugal method, as well as the examination of the exposure and mask properties are disclosed in the following publications:

Novel Si-Containing Resist, Y. Yamashita, M. Kaziwara, J. Electrochem. Soc., Band 137, No. 10, Oct. 1990, pages 3253 to 3257;

Submicron Pattern Transfer with New Designed E-Beam Resist and Bias-ECR Etcher, S. Sogito, S. Ishida, Y. Iida, Microelectronic Engineering 9, 1989, pages 533 to 536;

Polysiloxanes with Pendant Cinnamoyl Groups as a Negative Deep UV Resist for Bilayer Applications, C. Rosilis, A. Rosilio, and B. Serre-Monanda, J. Electrochem. Soc., Vol. 136, No. 8, August 1989, pages 2350 to 2354;

A Comparison for the E-Beam Sensitivities and Relative $O_2$-Plasma Stabilities of Organosilicon Polymers, E. Babich et al., Microelectronic Engineering 9, 1989, pages 537 to 542; and Novel Process for Direct Delineation of Spin on Glass (SOG), A. Imai et al., Jap. J. of Appl. Physics, Vol. 29, November 1990, page 2653.

Many processes are not suitable for having the top resist lacquer applied by means of the centrifugal method. For example, the centrifugal method or spin-on technique is not suitable for use with cluster tools. In the field of semiconductor technology, the term cluster tool describes a system comprising a central manipulator located within a vacuum area which is provided in the system. A cluster tool is not to be confused with a plurality of separate units which are arranged in a clean room. The central manipulator is adapted to have supplied thereto wafers in a charging box, whereupon it will feed the wafers to a plurality of processing stations and tools, respectively, depending on the processes to be carried out. Methods which are suitable for use with cluster tools must not include any wet processes, and must not take place in the ambient atmosphere.

It is the object of the present invention to provide a method for applying a lacquer film, sensitive to UV and/or electron beam radiation, to a substrate to be masked so it can be employed in a wider range of applications.

SUMMARY OF THE INVENTION

This object is achieved by applying a lacquer film which is sensitive to UV and/or electron beam radiation to a substrate to be masked, comprising the method steps of:

vaporizing a vinyl-containing substance and a linear or cyclic siloxane; and depositing these vaporized substances onto the substrate to be masked.

The invented method comprises the step of depositing a lacquer film in its gaseous form, which is sensitive to UV and/or electron beam radiation, onto a substrate. For this purpose, a vinyl-containing substance and a siloxane are vaporized and deposited onto the substrate.

The present invention performs particularly well when trivinylmethylsilane (TVMS) is the supplier of the vinyl groups and octamethylcyclotetrasiloxane (OMCTS) is used as the silicon or $SiO_2$ source.

In a preferred embodiment of the invention, the method includes the method steps of:

dosing the substances with the aid of liquid mass flow control means;

vaporizing the substances;

distributed introduction of the vaporized substances in a reaction chamber by means of a discharge shower; and reaction of the substances in an HF field.

In a preferred embodiment of the invention, the deposition of the substances while in their gaseous state is carried out at a pressure of 0.3 to 1.5 mbar.

In a preferred embodiment of the invention, the reaction is carried out at an HF power density of 0.06 to 0.6 $W/cm^2$.

In another preferred embodiment of the invention, the temperature of the substrate is from 20° to 90° C.

BRIEF DESCRIPTION OF THE DRAWINGS

The invention will be more readily understood with reference to the following detailed description and the appended drawings, in which.

DETAILED DESCRIPTION

In a preferred embodiment of the invented method, the substances to be vaporized, i.e., octamethylcyclotetrasiloxane and trivinylmethylsilane (OMCTS and TVMS), are dosed utilizing a liquid mass flow control means and then vaporized. Then, the substances are introduced uniformly into a reaction chamber via a discharge shower; this can be done without any further reaction or transport gases being necessary. In the reaction chamber, the reaction of the substances takes place in an HF field of a parallel plate system at 13.5 MHz.

Deposition results can be achieved in a wide HF power and pressure range. Typical power densities range from 0.06 $W/cm^2$ to 0.6 $W/cm^2$.

Figure 1:
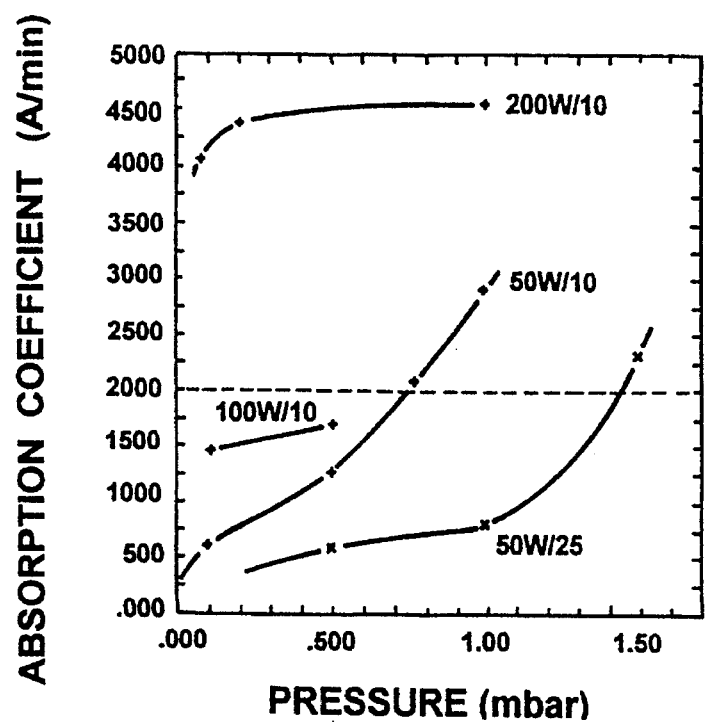
FIG. 1 shows deposition rates for the deposition of the lacquer film sensitive to UV and/or electron beam radiation relative to power, pressure and flow.

In the present invention, the pressure range lies between 0.3 mbar and 1.5 mbar. As can be seen in FIG. 1, deposition rates range from 500 to 5000 A/min (Angstroms per minute). The substrate temperatures range from 20° C. to 90° C.

In a preferred embodiment high concentrations of vinyl groups are maintained in the layer to be applied to the substrate.

Figure 2:
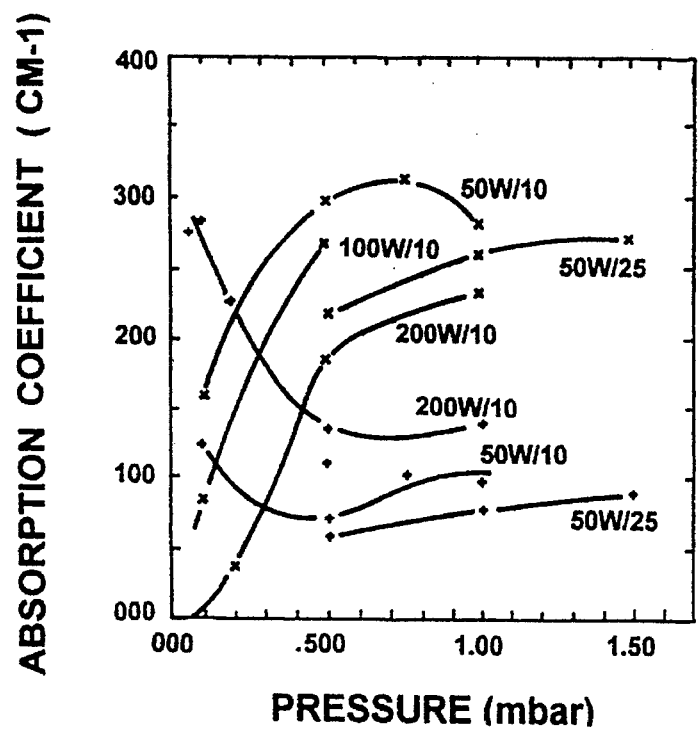
FIG. 2 shows concentration characteristics of vinyl groups and SiH groups in relation to power, pressure and flow.

FIG. 2 shows the results of a combined evaluation by means of IR spectroscopy and ellipsometry. Absorption coefficients exceeding 250 $cm^{-1}$ refer to a top resist layer which is adapted to be exposed. Deposition conditions are most favorable when the absorption coefficients exceed 250 $cm^{-1}$.

In FIGS. 1 and 2 the respective deposition rates and the absorption co-efficients in relation to pressure, are indicated by the following values for the HF power and the flow as parameters: 50 W/10 sccm, 100 W/10 sccm, 200 W/10 sccm, 50 W/25 sccm.

In connection with the parallel plate system used, a total power of 100 W corresponds to a power density of 0.318 $W/cm^2$.

In FIG. 2, the concentration of the respective vinyl groups is marked by a (*) and that of the respective SiH groups is marked by a (+).

The UV sensitivity and the sensitivity to electron beams was detected by means of IR spectroscopy and wet development.

Figure 3:
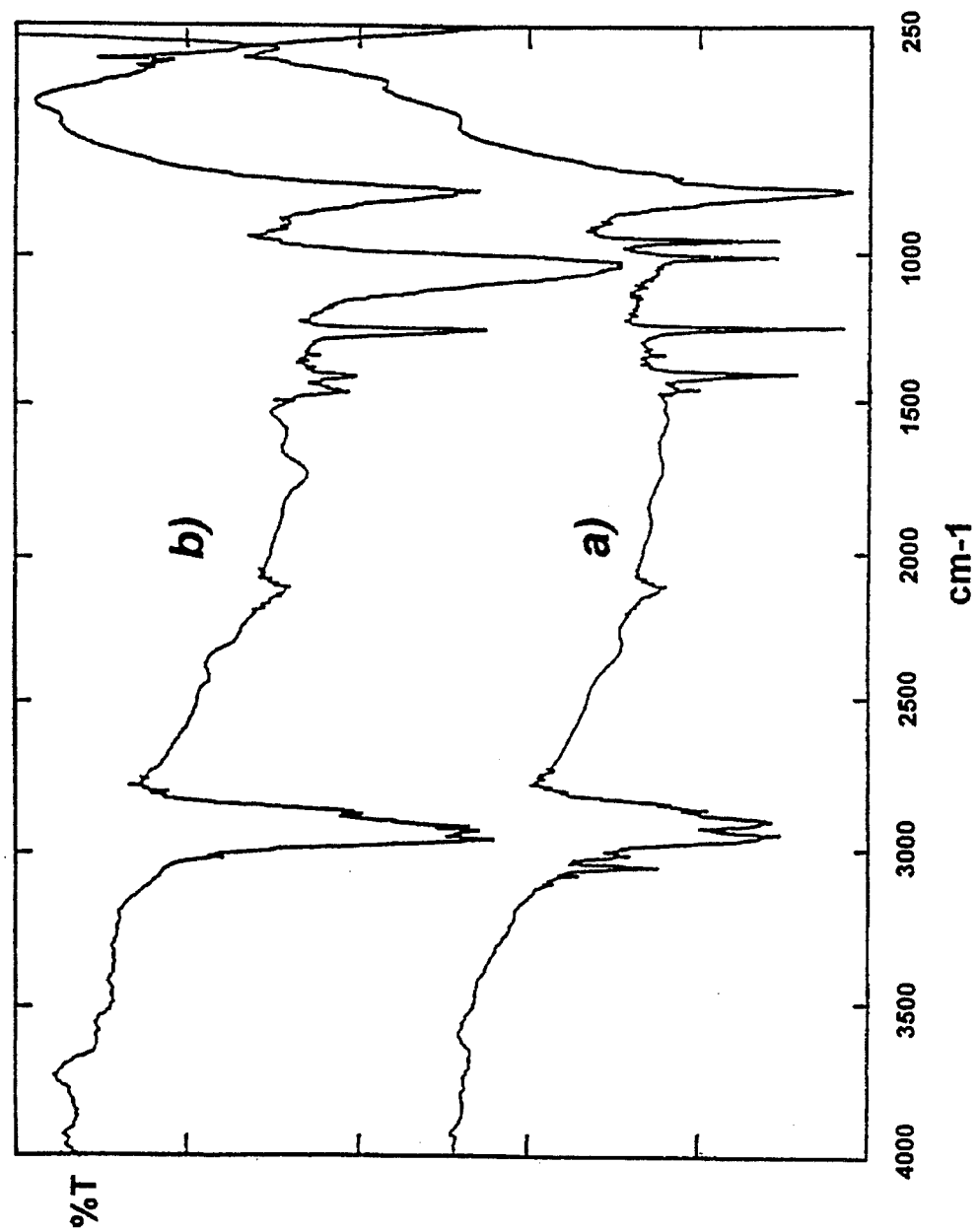
FIG. 3 shows an IR (infrared) spectroscopy of a layer of TVMS.
Figure 4:
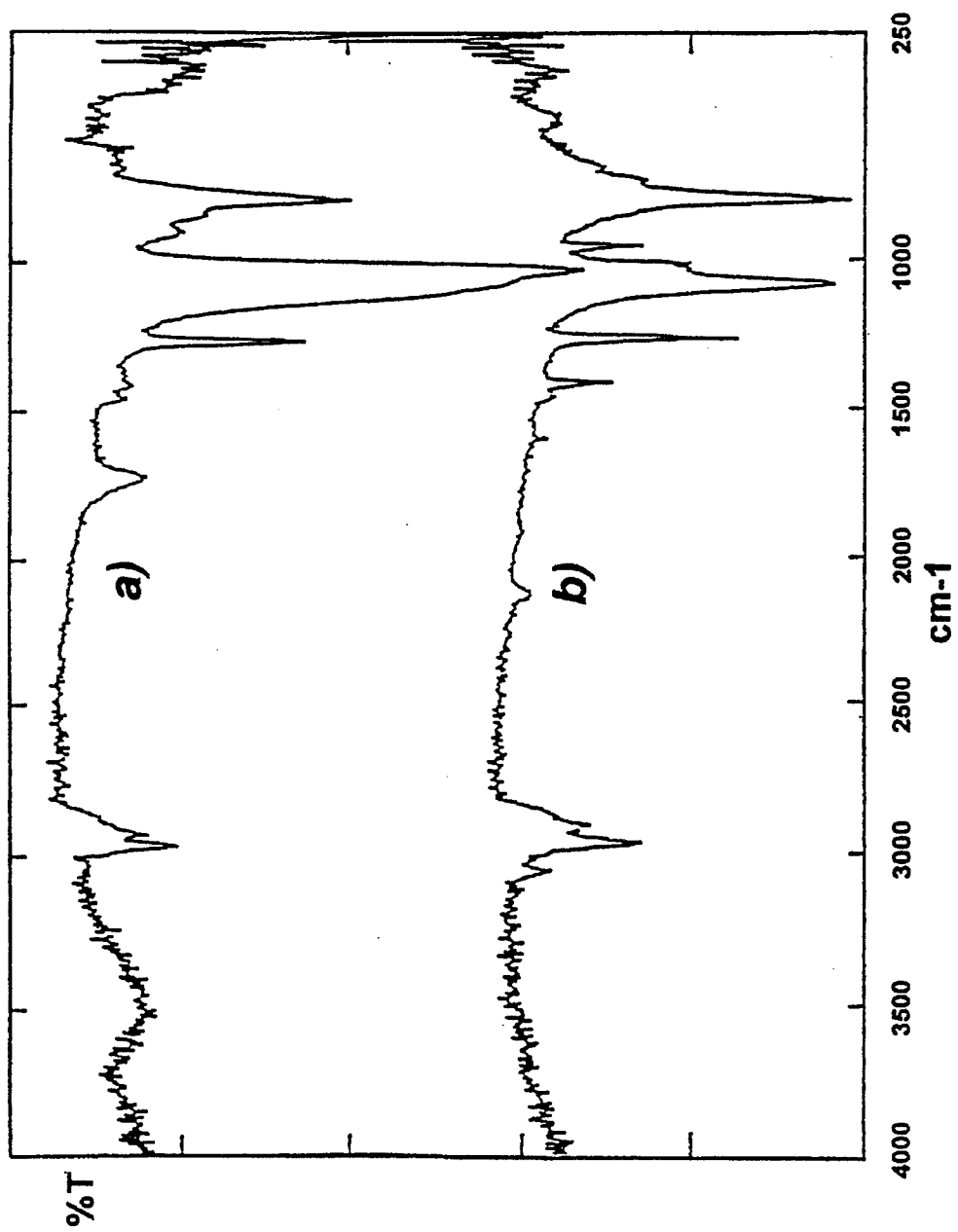
FIG. 4 shows an IR spectroscopy of a layer of TVMS/OMCTS.

FIGS. 3 and 4 show layers of TVMS as well as TVMS/OMCTS before and after an exposure to UV light. Curve (a) in each of the figures represents the degree of IR spectroscopy after deposition. Curve (b) in each of the figures represents the degree of IR spectroscopy after UV exposure with a wavelength of less than 200 nm.

In FIG. 3, the peak values at the wave numbers 3052, 1406, 1010 and 956 $cm^{-1}$ can be associated with vinyl groups. Peak values at 1252 and 805 $cm^{-1}$ correspond to $SiCH_3$ vibrations. After the exposure, the vinyl peak values will disappear. Instead of the vinyl peak values, a new high peak value appearing at 1038 $cm^{-1}$ indicates an additional cross linking of Si atoms via carbon chains.

When FIG. 4 is compared with FIG. 3, it can be seen that the peak values of the vinyl groups and those for Si—$CH_3$ appear at the same locations as those on curve (a) in FIG. 3. Due to the presence of siloxane rings resulting from OMCTS, additional peak values will appear at 1078 $cm^{-1}$ (Si—O—Si stretching) and at 1261 $cm^{-1}$ (Si—$CH_3$). In this case, the vinyl peak values disappear after the exposure and the peak value will appear at 1038 $cm^{-1}$. This does not seem to have any influence on the siloxane rings.

The chemical changes in the layer can be detected on the basis of the vinyl peak values at 3052, 1594, 1406, 1010 and 956 $cm^{-1}$. After the exposure, these peak values will disappear and one high peak value at 1040 $cm^{-1}$ will remain. The high peak value indicates an additional cross-linking of Si atoms via —$CH_2$— or —$CH_2CH_2$— bonds. The exposed areas are insoluble in organic solvents.

The present invention has a top resist lacquer which is sensitive to wavelengths of greater than or equal to 200 nm in the excitation wavelength range and can be applied by direct deposition from the gas phase.

The invented method is suitable for use with cluster tools and it is adapted to be integrated in various semiconductor processes.

What is claimed is:

1. A method of applying a lacquer film which is sensitive to UV or electron beam radiation to a substrate to be masked, comprising the method steps of:

vaporizing a vinyl-containing substance and a linear or cyclic siloxane substance to form a vapor mixture; and depositing the vapor mixture onto the substrate to be masked.

2. A method according to claim 1, wherein said siloxane is octamethylcyclotetrasiloxane.

3. A method according to claim 1, wherein said vinyl-containing substance is trivinylmethylsilane.

4. A method according to claim 1, wherein the vapor mixture is deposited at a pressure of 0.3 to 1.5 mbar.

5. A method according to claim 1, further comprising the step of heating said substrate to a temperature between 20° and 90° C.

6. A method of applying a lacquer film which is sensitive to UV or electron beam radiation to a substrate to be masked, comprising the method steps of:

vaporizing a vinyl-containing substance and a linear or cyclic siloxane substance to form a vapor mixture;

introducing the vapor mixture into a reaction chamber via a discharge shower;

carrying out a chemical reaction of the substances in a high frequency (HF) field; and depositing the chemically reacted substances onto the substrate to be masked.

7. A method according to claim 6, wherein said chemical reaction of the substances is carried out at an HF power density of from 0.06 to 0.6 $W/cm^2$.

* * * * *